Figure 1:
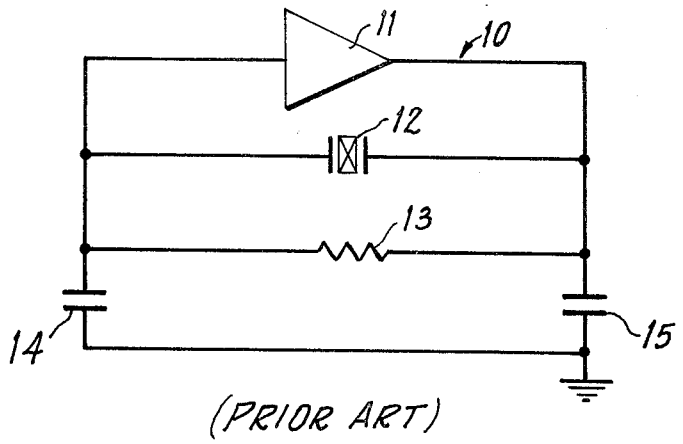
Figure 2:
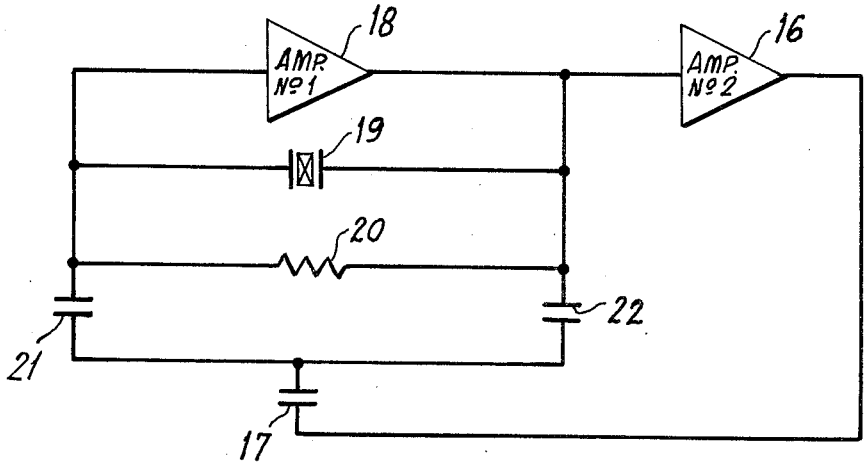
Figure 3:
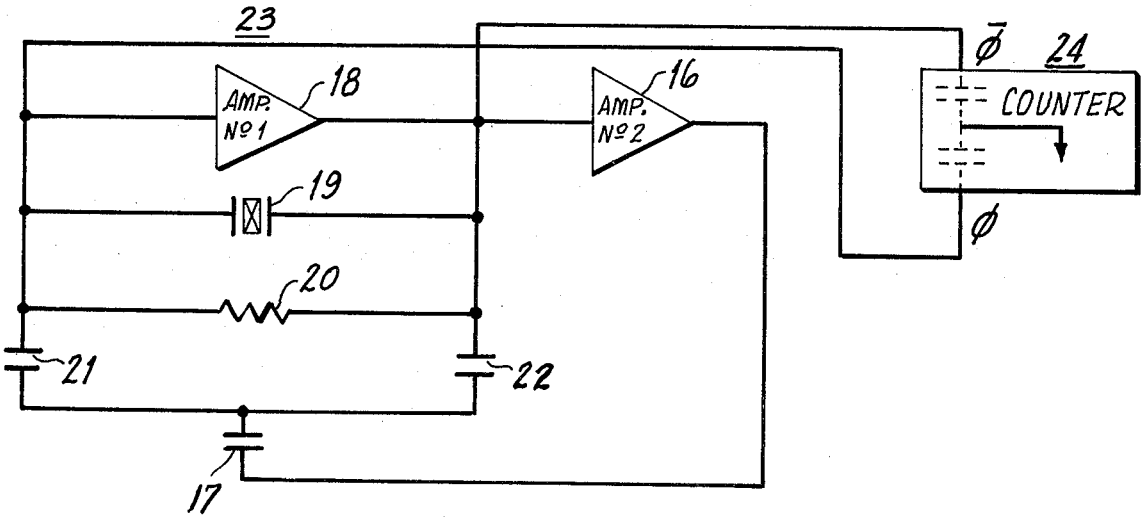

DEFENSIVE PUBLICATION

UNITED STATES PATENT AND TRADEMARK OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent and Trademark Office makes no assertion as to the novelty of the disclosed subject matter.

PUBLISHED JULY 6, 1976

948 O.G. 5

T948,002
QUARTZ CRYSTAL OSCILLATOR
Eugene R. Keeler, Camp Hill, Pa., assignor to Timex Corporation, Waterbury, Conn.
Filed Apr. 28, 1975, Ser. No. 572,362
Int. Cl. H03b *5/36*
U.S. Cl. 331—116 R
1 Sheet Drawing. 9 Pages of Specification

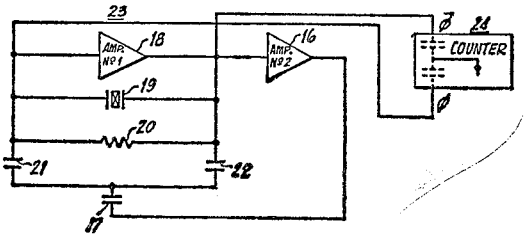

A Pierce type oscillator comprises a parallel resonant crystal and an inverting amplifier which provides the required signal inversion and voltage gain. The subject oscillator is essentially a modified Pierce circuit including first and second amplifiers wherein the second amplifier is used to provide a signal in phase with the signal at the input of the first amplifier, said first amplifier acting basically as a Pierce circuit. The second amplifier reinforces the tendency of the first amplifier to oscillate. The crystal oscillator comprising the present invention can be configured to use less power than an equivalent Pierce oscillator and may be used advantageously in electronic watch circuits.

QUARTZ CRYSTAL OSCILLATOR

Original Filed April 28, 1975